United States Patent
Yang

(10) Patent No.: US 9,537,118 B2
(45) Date of Patent: Jan. 3, 2017

(54) ORGANIC LIGHT EMITTING DIODE DISPLAY AND MANUFACTURING METHOD THEREOF

(71) Applicant: Samsung Display Co., Ltd., Yongin, Gyeonggi-do (KR)

(72) Inventor: Yong-Ho Yang, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/792,924

(22) Filed: Jul. 7, 2015

(65) Prior Publication Data

US 2015/0311478 A1  Oct. 29, 2015

Related U.S. Application Data

(62) Division of application No. 13/834,833, filed on Mar. 15, 2013, now Pat. No. 9,105,633.

(30) Foreign Application Priority Data

Jul. 30, 2012  (KR) .......................... 10-2012-0083249

(51) Int. Cl.
| | | |
|---|---|---|
| *H01L 51/56* | (2006.01) | |
| *H01L 51/52* | (2006.01) | |
| *H01L 21/52* | (2006.01) | |
| *H01L 27/32* | (2006.01) | |

(52) U.S. Cl.
CPC .............. *H01L 51/56* (2013.01); *H01L 21/52* (2013.01); *H01L 27/3276* (2013.01); *H01L 51/52* (2013.01); *H01L 51/5203* (2013.01); *H01L 51/5237* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 2002/0153618 A1 | 10/2002 | Hirano et al. | |
| 2004/0147092 A1* | 7/2004 | Liao ................ | H01L 21/76254 438/438 |

FOREIGN PATENT DOCUMENTS

| | | |
|---|---|---|
| KR | 10-2007-0050774 | 5/2007 |
| KR | 10-2007-0104468 | 10/2007 |
| KR | 10-2006-0065369 | 6/2009 |

* cited by examiner

*Primary Examiner* — Fernando L Toledo
*Assistant Examiner* — Valerie N Newton
(74) *Attorney, Agent, or Firm* — Knobbe Martens Olson & Bear LLP

(57) ABSTRACT

An organic light emitting diode display includes a substrate including a display region displaying an image and a peripheral region surrounding the display region, a plurality of pad wires formed in the peripheral region of the substrate, and a plurality of bumps formed between the plurality of pad wires. The organic light emitting diode display blocks or relieves impact which is generated when a temporary upper protective film is half-cut and applied to a plurality of pad wires or an insulating layer by forming a plurality of bumps between the plurality of pad wires, thus preventing a damage to the pad wires or the insulating layer.

5 Claims, 10 Drawing Sheets

ORGANIC LIGHT EMITTING DIODE DISPLAY AND MANUFACTURING METHOD THEREOF

CROSS-REFERENCE TO RELATED APPLICATIONS

This application is a divisional of U.S. patent application Ser. No. 13/834,833 filed Mar. 15, 2013, which claims priority to, and the benefit of, Korean Patent Application No. 10-2012-0083249 filed in the Korean Intellectual Property Office on Jul. 30, 2012, the entire contents of which are incorporated herein by reference in their entireties.

BACKGROUND

Field

The described technology relates generally to an organic light emitting diode display and a manufacturing method thereof.

Description of the Related Technology

An organic light emitting diode display includes organic light emitting elements constituted by a hole injection electrode, an organic emission layer, and an electron injection electrode. Each organic light emitting element emits light by energy generated when an exciton generated by combining an electron and a hole in the organic emission layer falls from an excited state to a bottom state, and the organic light emitting diode display displays a predetermined image by using this light emission.

Since the organic light emitting diode display has a self-luminance characteristic and a separate light source is not required, unlike a liquid crystal display, a thickness and a weight thereof may be reduced. Further, since the organic light emitting diode display exhibits high quality characteristics such as low power consumption, high luminance, and rapid response speed, the organic light emitting diode display receives attention as a next generation display device.

The organic light emitting element may be deteriorated by internal factors such as deterioration of the organic emission layer by oxygen from indium tin oxide (ITO) used as the electrode material, and deterioration by a reaction between interfaces of organic material layers constituting the organic emission layer, and may be deteriorated by external factors such as external moisture, oxygen, or ultraviolet rays (UV). Particularly, since external oxygen and moisture significantly affect a life-span of the organic light emitting element, a packaging technology for sealing the organic light emitting element is very important.

The organic light emitting element needs to be thinly manufactured and/or to be manufactured so as to be easily bent so that the organic light emitting element is applied to various applications. A thin film encapsulation (TFE) technology has been developed in order to manufacture the organic light emitting element, which is thin and bendable. The thin film encapsulation technology is a technology in which one or more inorganic layers and organic layers are alternately laminated on the organic light emitting elements formed in a display region of a substrate to cover the display region with a thin film encapsulation layer. The organic light emitting diode display having the thin film encapsulation layer may be easily bent and is advantageous to slimness in the case where the substrate is formed of a flexible film.

The organic light emitting element including a flexible film as the substrate may be damaged during a manufacturing process (for example, a cutting process and the like) because the organic light emitting element is vulnerable to external impact. As described above, a structure of an organic light emitting element that can prevent damage due to a process accompanying the impact, and a manufacturing method thereof are required.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

The described technology has been made in an effort to provide an organic light emitting diode display that can prevent defects by a cutting process, and a manufacturing method thereof.

One embodiment provides an organic light emitting diode display including: a substrate including a display region displaying an image and a peripheral region surrounding the display region; a plurality of pad wires formed in the peripheral region; and a plurality of bumps each respectively formed between a subset of the plurality of pad wires.

One or more bumps may be respectively formed in spaces between two adjacent pad wires, or one or more bumps may respectively be formed only in some spaces between two adjacent pad wires.

The plurality of bumps may be formed on a different layer than a layer of the plurality of pad wires.

The organic light emitting diode display may further include: an insulating layer formed on the substrate, and a protective layer formed on the insulating layer and covering the display region, in which the plurality of bumps may be formed in the peripheral region on the insulating layer, and the plurality of pad wires may be formed under the insulating layer.

Each of the plurality of bumps may include a plurality of bump sub-layers.

A width of an upper bump sub-layer positioned on an upper portion may be smaller than a width of a lower bump sub-layer positioned on a lower portion.

The organic light emitting diode display may further include: an upper pad wire formed on the same layer as the plurality of bumps.

At least one of the plurality of bumps may be formed between the upper pad wire and the pad wire.

At least one of the upper pad wire and the pad wire may be formed between adjacent bumps.

The plurality of bumps may be formed on the same layer as the plurality of pad wires.

The organic light emitting diode display may further include: an insulating layer formed on the substrate, and a protective layer formed on the insulating layer and covering the display region, in which the plurality of bumps and the plurality of pad wires may be formed in the peripheral region on the insulating layer.

The plurality of bumps may be formed of the same material as the protective layer.

A width of the bump may be smaller than an interval between adjacent pad wires.

The substrate may be a flexible substrate.

Another embodiment provides a manufacturing method of an organic light emitting diode display, including: forming a plurality of pad wires in a peripheral region of a substrate including a display region displaying an image and the peripheral region surrounding the display region; forming a plurality of bumps between the plurality of respective pad wires; and attaching a temporary upper protective film onto the plurality of pad wires and bumps.

One or more bumps may be respectively formed in spaces between adjacent pad wires, or one or more bumps may be respectively formed only in some spaces between adjacent pad wires.

The manufacturing method of an organic light emitting diode display may further include: forming an insulating layer on the substrate and the plurality of pad wires; and forming a protective layer covering the display region on the insulating layer, in which the plurality of bumps may be formed in the peripheral region on the insulating layer.

The manufacturing method of an organic light emitting diode display may further include: half-cutting a peripheral portion of the temporary upper protective film by using a cutter.

The manufacturing method of an organic light emitting diode display may further include: removing the temporary upper protective film.

According to the certain embodiments, an organic light emitting diode display blocks or relieves impact which is generated when a temporary upper protective film is half-cut and applied to a plurality of pad wires or an insulating layer by forming a plurality of bumps between a plurality of pad wires, thus preventing a damage to the pad wires or the insulating layer.

DETAILED DESCRIPTION OF CERTAIN INVENTIVE EMBODIMENTS

Figure 1:
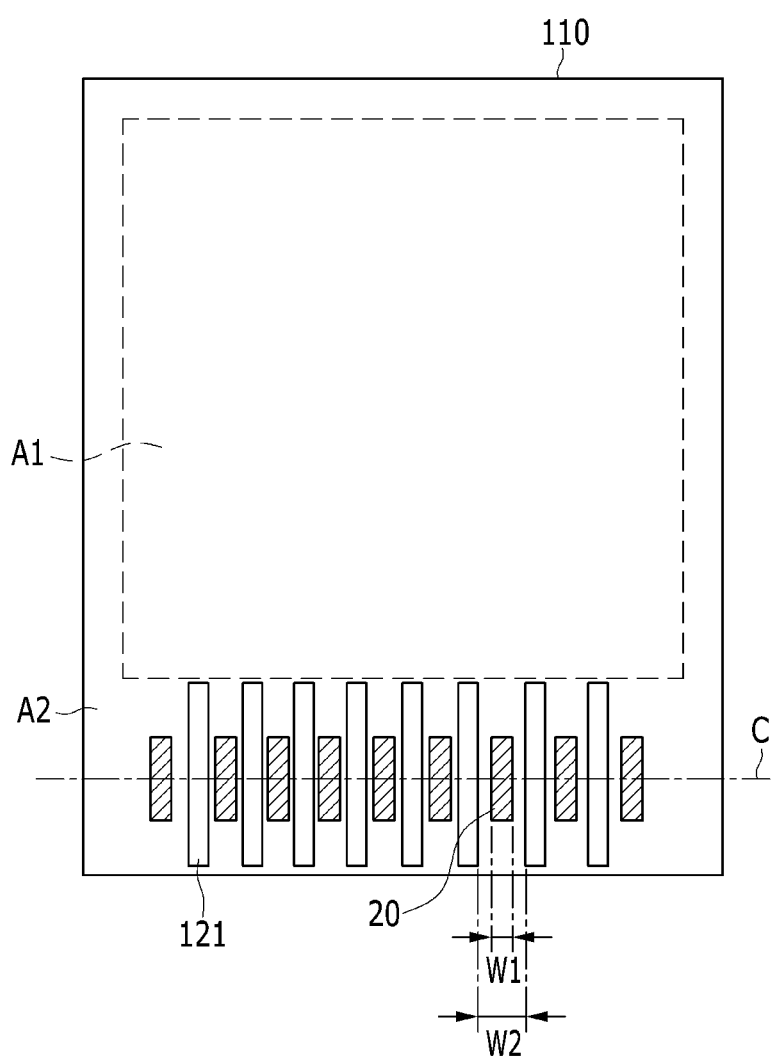
FIG. 1 is a top plan view of an organic light emitting diode display according to a first embodiment.

Hereinafter, the present invention will be described more fully hereinafter with reference to the accompanying drawings, in which certain embodiments of the invention are shown. As those skilled in the art would realize, the described embodiments may be modified in various ways, without departing from the spirit or scope of the present invention.

In order to describe the embodiments, a portion that does not relate to the description is omitted, and the same reference numerals generally designate the same or like constituent elements throughout the specification.

In addition, the size and thickness of each component shown in the drawings are arbitrarily shown for understanding and ease of description, but the present invention is not limited thereto.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements.

An organic light emitting diode display according to an embodiment will be described in detail with reference to FIGS. 1 to 3.

Figure 2:
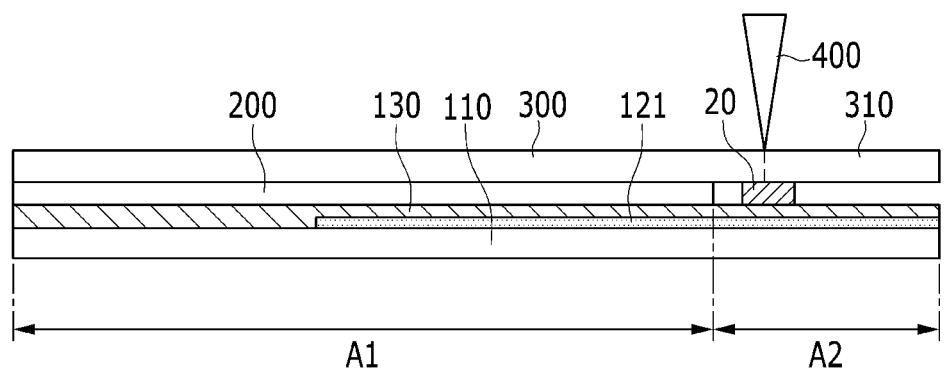
FIG. 2 is a side view of the organic light emitting diode display according to the first embodiment.
Figure 3:
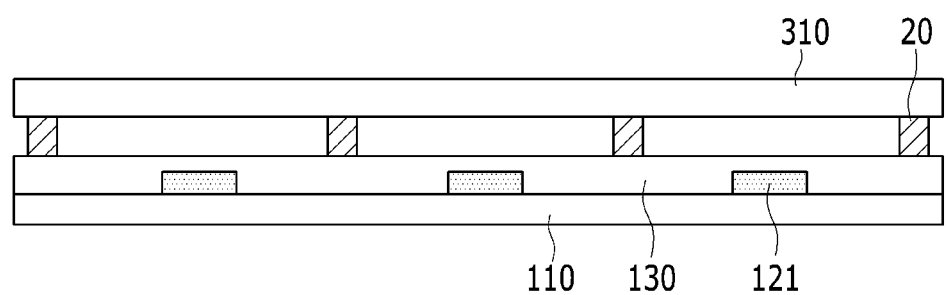
FIG. 3 is a cross-sectional view of the organic light emitting diode display according to the first embodiment.

FIG. 1 is a top plan view of an organic light emitting diode display according to a first embodiment, FIG. 2 is a side view and FIG. 3 is a cross-sectional view of the organic light emitting diode display according to the first embodiment.

The organic light emitting diode display according to the first embodiment includes a substrate 110 including a display region A1 displaying an image and a peripheral region A2 surrounding the display region A1, a plurality of pad wires 121 formed in the peripheral region A2 of the substrate 110, an insulating layer 130 covering the substrate 110 and a plurality of pad wires 121, a protective layer 200 formed on the insulating layer 130 and covering the display region A1, and a plurality of bumps 20 formed on the insulating layer 130 and formed between the plurality of pad wires 121.

The substrate 110 may be easily bent, and may be a flexible substrate advantageous to slimness.

A plurality of signal lines for displaying an image, and a switching transistor, a driving transistor (not shown), and the like connected thereto are formed in the display region A1 on the substrate 110. The signal lines include a scanning signal line transferring a gate signal (or a scan signal), a data line transferring a data signal, a driving voltage line transferring a driving voltage, and the like. The pad wires 121 such as a pan out portion are formed in the peripheral region A2 in order to apply a signal from the outside to a plurality of signal lines.

A plurality of pad wires 121 is disposed to be spaced apart from each other, and a plurality of pad wires 121, a plurality of signal lines, and the like are covered with the insulating layer 130 formed of an inorganic layer and the like.

The protective layer 200 for planarizing the display region A1 is formed in the display region A1 on the insulating layer 130, and a plurality of bumps 20 is formed in the peripheral region A2 on the insulating layer 130. Accordingly, the plurality of bumps 20 is formed on a layer that is different from a layer of a plurality of pad wires 121. The protective layer 200 may be connected to the signal line and the transistor, and may cover an organic light emitting diode emitting light and the like.

The plurality of bumps 20 may be formed of the same material as the protective layer 200, and a width W1 of each bump 20 may be smaller than an interval W2 between the adjacent pad wires 121. Therefore, the bump 20 does not overlap the pad wire 121.

One or more bumps 20 of a plurality of bumps 20 are formed in all spaces between the adjacent pad wires 121. Accordingly, impact by the cutter 400 may be diminished.

In addition, a temporary upper protective film 300 is attached to the protective layer 200 and the plurality of bumps 20. The temporary upper protective film 300 is attached to prevent the protective layer 200 and the like from being damaged during a manufacturing process.

As described above, it is possible to block or relieve impact which is generated in the case when the temporary upper protective film 300 is half-cut along a cutting line C by using the cutter 400 in order to expose a plurality of pad wires 121 and applied to a plurality of pad wires 121 or the insulating layer 130 by forming a plurality of bumps 20 on the insulating layer 130 covering a plurality of pad wires 121 and forming a plurality of bumps 20 between a plurality of pad wires 121, thereby preventing a damage to the pad wire 121 or the insulating layer 130.

Next, a method of manufacturing the organic light emitting diode display shown in FIGS. 1 to 3 according to the first embodiment will be described in detail with reference to FIGS. 4 and 5.

Figure 4:
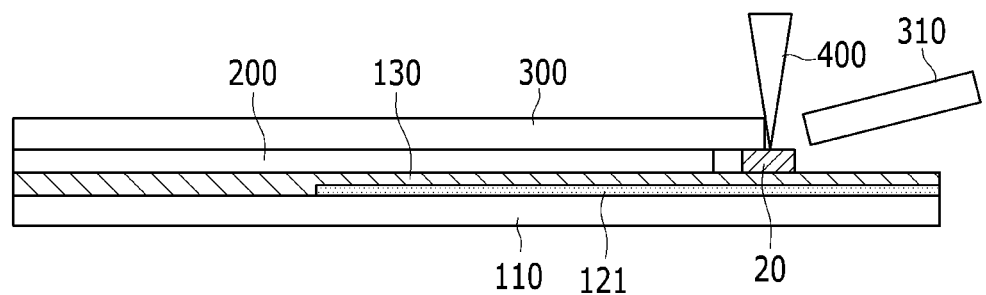
FIGS. 4 and 5 are cross-sectional views sequentially showing a manufacturing method of the organic light emitting diode display according to the first embodiment.
Figure 5:
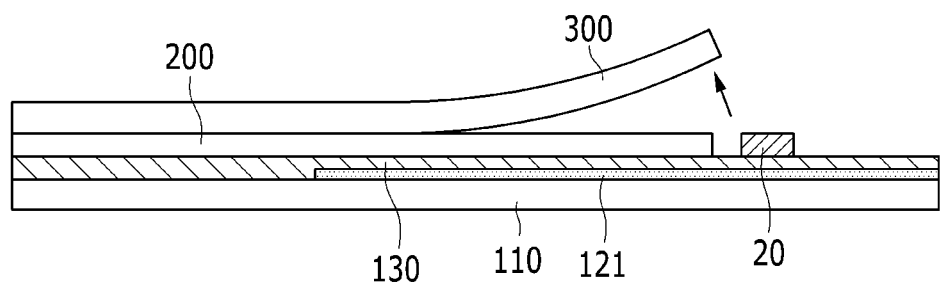

FIGS. 4 and 5 are cross-sectional views sequentially showing a manufacturing method of the organic light emitting diode display according to the first embodiment.

First, a plurality of pad wires 121 is formed in the peripheral region A2 of the substrate 110, an insulating layer 130 covering a plurality of pad wires 121 is formed, and a plurality of bumps 20 is formed on the insulating layer 130. Each bump 20 is formed between a plurality of pad wires 121. In addition, a temporary upper protective film 300 is attached onto the bump 20.

Next, as shown in FIG. 4, a film peripheral portion 310 of the temporary upper protective film 300 is half-cut by using the cutter 400 to be divided. The bump 20 relieves or blocks transferring of physical impact of the cutter 400 to the pad wire 121. As described above, it is possible to prevent damage to the pad wire 121 or the insulating layer 130 by blocking or relieving application of impact generated when the temporary upper protective film 300 is half-cut to the plurality of pad wires 121 or the insulating layer 130.

Next, as shown in FIG. 5, the temporary upper protective film 300 is removed from the organic light emitting diode display.

In the first embodiment, the bump 20 is formed of a single layer, in other embodiments, the bump is formed of a plurality of bump sub-layers.

Hereinafter, referring to FIG. 6, an organic light emitting diode display according to the second embodiment will be described.

Figure 6:
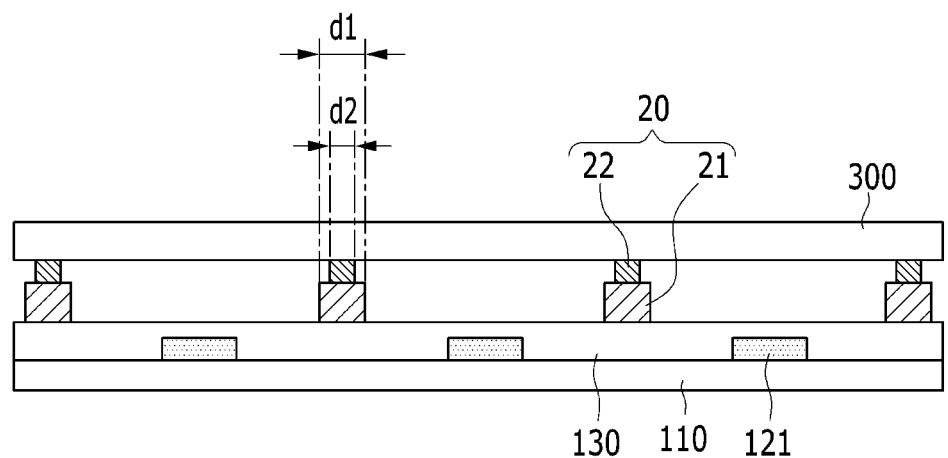
FIG. 6 is a cross-sectional view of an organic light emitting diode display according to a second embodiment.

FIG. 6 is a cross-sectional view of an organic light emitting diode display according to a second embodiment.

The second embodiment is substantially the same as the first embodiment shown in FIG. 1 with the exception of the structure of the bump, and thus a repeated description thereof will be omitted.

As shown in FIG. 6, the bump 20 of the organic light emitting diode display according to the second embodiment includes a plurality of bump sub-layers 21 and 22. The width d2 of the upper bump sub-layer 22 positioned on the upper portion may be smaller than the width d1 of the lower bump sub-layer 21 positioned on the lower portion. As described above, the bump 20 may be formed to have a double step.

In embodiments where the bump 20 has the double step, impact is first absorbed in the upper bump sub-layer 22, and the impact is absorbed again in the lower bump sub-layer 21, such that relieving of impact may be maximized to more completely protect the pad wire 121. A plurality of bump sub-layers 21 and 22 may be formed by using a half tone mask. FIG. 6 shows only two bump sub-layers, but the bump may be formed of three or more bump sub-layers.

In the first embodiment, the bump and the pad wire are formed on different layers, in other embodiments, the bump and the pad wire may be formed on the same layer.

Hereinafter, referring to FIG. 7, an organic light emitting diode display according to a third embodiment will be described.

Figure 7:
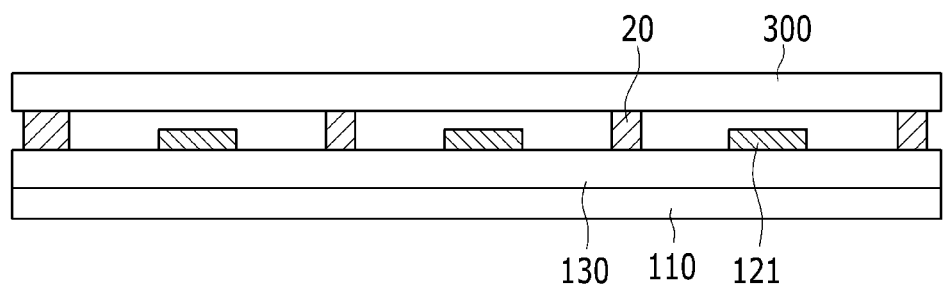
FIG. 7 is a cross-sectional view of an organic light emitting diode display according to a third embodiment.

FIG. 7 is a cross-sectional view of the organic light emitting diode display according to the third embodiment.

The third embodiment is substantially the same as the first embodiment shown in FIG. 1 with the exception of the formation positions of the bump and the pad wire, and thus a repeated description thereof will be omitted.

As shown in FIG. 7, the organic light emitting diode display according to the third embodiment includes an insulating layer 130 covering the substrate 110, a protective layer 200 formed on the insulating layer 130 and covering the display region A1, and a plurality of pad wires 121 and a plurality of bumps 20 formed in the peripheral region A2 on the insulating layer 130. The plurality of bumps 20 is formed between a plurality of pad wires 121. As described above, the plurality of bumps 20 is formed on the same layer as the plurality of pad wires 121. In some embodiments, heights of the plurality of pad wires 121 may be larger than those of the bumps 20. This is to allow the bump 20 to absorb impact from the cutter 400.

In addition, a temporary upper protective film 300 is attached onto the protective layer 200 and a plurality of bumps 20. As described above, it is possible to prevent a damage to the pad wire 121 or the insulating layer 130 by forming a plurality of bumps 20 between the plurality of pad wires 121 and setting the heights of the plurality of pad wires 121 to be larger than those of the bumps 20 to block or relieve application of impact generated in the case where the temporary upper protective film 300 is half-cut to the plurality of pad wires 121 or the insulating layer 130.

In the first and the third embodiments, the bump is formed between the pad wires formed on any one layer, in other embodiments, the bumps may be formed where the pad wires are formed on a plurality of layers.

Hereinafter, referring to FIGS. 8 and 9, organic light emitting diode displays according to the fourth and fifth embodiments will be described.

Figure 8:
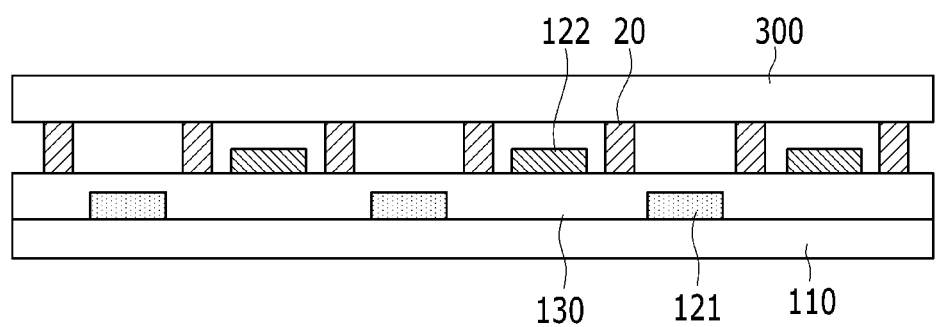
FIG. 8 is a cross-sectional view of an organic light emitting diode display according to a fourth embodiment.
Figure 9:
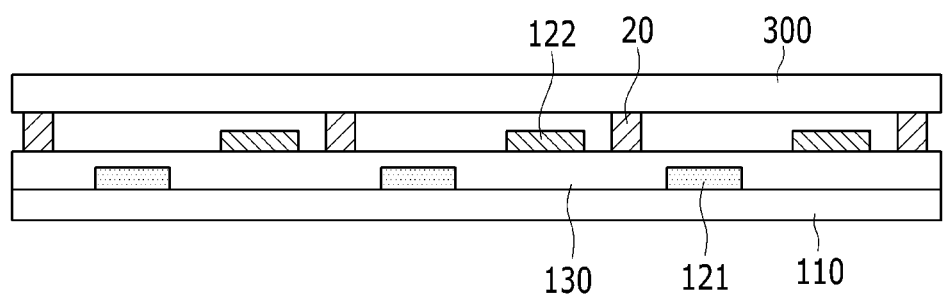
FIG. 9 is a cross-sectional view of an organic light emitting diode display according to a fifth embodiment.

FIGS. 8 and 9 are cross-sectional views of the organic light emitting diode displays according to the fourth and fifth embodiments, respectively.

The fourth and the fifth embodiments are substantially the same as the first embodiment shown in FIG. 1 with the exception of the formation positions of the bump and the pad wire, and thus a repeated description thereof will be omitted.

As shown in FIG. 8, the organic light emitting diode display according to the fourth embodiment includes a plurality of pad wires 121 formed in the peripheral region A2 of the substrate 110, an insulating layer 130 covering the substrate 110 and a plurality of pad wires 121, the protective layer 200 formed on the insulating layer 130 and covering the display region A1, and a plurality of upper pad wires 122 and a plurality of bumps 20 formed on the insulating layer 130.

The bumps 20 may be formed between the upper pad wire 122 and the pad wire 121, and only the upper pad wire 122 or only the pad wire 121 may be formed between the adjacent bumps 20.

Further, as shown in FIG. 9, in the organic light emitting diode display according to the fourth embodiment, the bumps 20 may be formed between the upper pad wire 122 and the pad wire 121, or both the upper pad wire 122 and the pad wire 121 may be formed between the adjacent bumps 20.

As described above, a plurality of bumps 20 may be formed so as not to overlap the upper pad wire 122 and the pad wire 121 to allow the bump 20 to first absorb impact generated in the case where the temporary upper protective film 300 is half-cut so that application of impact to a plurality of upper pad wires 122 or pad wires 121 is blocked or relieved, thus preventing a damage to the upper pad wires 122 or the pad wires 121.

In the first embodiment, the bumps are formed in all spaces between the adjacent pad wires, in other embodiments, the bumps may be formed only in some spaces between the adjacent pad wires.

Hereinafter, referring to FIG. 10, an organic light emitting diode display according to the sixth embodiment will be described.

Figure 10:
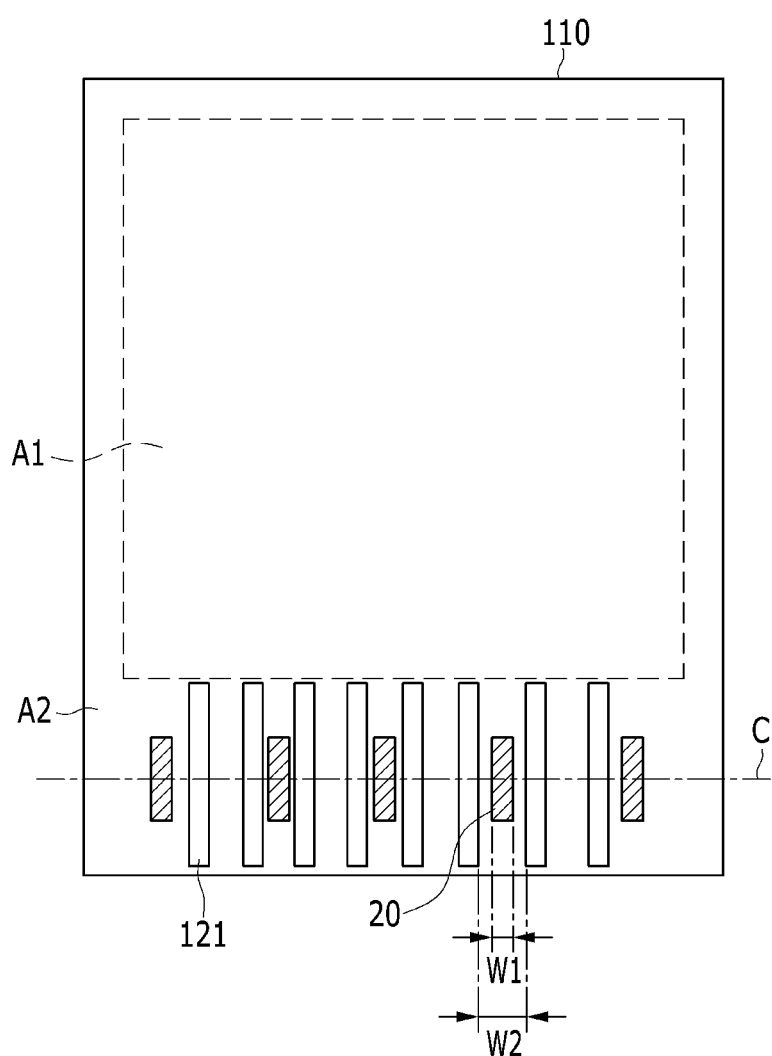
FIG. 10 is a top plan view of an organic light emitting diode display according to a sixth embodiment.

FIG. 10 is a top plan view of an organic light emitting diode display according to the sixth embodiment.

The sixth embodiment is substantially the same as the first embodiment shown in FIG. 1 with the exception of the formation position of the bump, and thus a repeated description thereof will be omitted.

As shown in FIG. 10, in the organic light emitting diode display according to the sixth embodiment, the bumps 20 are formed only in some spaces between the adjacent pad wires 121. That is, the bumps 20 are not formed in all spaces between the adjacent pad wires 121, but are formed only in some spaces between the pad wires 121. As described above, the bumps 20 may be disposed at a periodic or non-periodic interval between the pad wires 121.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 20: Bump | 110: Substrate |
| 121: Pad wire | 122: upper pad wire |
| 130: Insulating layer | 200: Protective layer |
| 300: Temporary upper protective film | 310: peripheral portion of temporary upper protective film |

What is claimed is:

1. A manufacturing method of an organic light emitting diode display, comprising:
   forming a plurality of pad wires in a peripheral region of a substrate, wherein the substrate includes a display region displaying an image and the peripheral region surrounding the display region;
   forming an insulating layer on the substrate and the plurality of pad wires;
   forming a protective layer covering the display region on the insulating layer;
   forming a plurality of bumps between the plurality of respective pad wires, wherein the plurality of bumps is formed in the peripheral region on the insulating layer; and
   attaching a temporary upper protective film onto the plurality of pad wires and bumps.

2. The manufacturing method of an organic light emitting diode display of claim 1, wherein:
   one or more bumps are respectively formed in spaces between adjacent pad wires.

3. The manufacturing method of an organic light emitting diode display of claim 1, wherein:
   one or more bumps are respectively formed only in some spaces between adjacent pad wires.

4. The manufacturing method of an organic light emitting diode display of claim 1, further comprising:
   half-cutting a peripheral portion of the temporary upper protective film by using a cutter.

5. The manufacturing method of an organic light emitting diode display of claim 4, further comprising:
   removing the temporary upper protective film.

* * * * *